United States Patent [19]
Bird et al.

[11] Patent Number: 5,115,407
[45] Date of Patent: May 19, 1992

[54] INTEGRATED CERTIFICATION-CALIBRATION SYSTEM FOR A TESTING SYSTEM HAVING MULTIPLE TEST INSTRUMENTS

[75] Inventors: Ronald W. Bird, Kent; David K. Shaffer, Seattle, both of Wash.

[73] Assignee: The Boeing Company, Seattle, Wash.

[21] Appl. No.: 684,066

[22] Filed: Apr. 10, 1991

Related U.S. Application Data

[62] Division of Ser. No. 467,781, Jan. 19, 1990.

[51] Int. Cl.⁵ .......................................... G06F 11/00
[52] U.S. Cl. ............... 364/551.01; 364/579; 324/73.1
[58] Field of Search .................. 364/424.03, 424.04, 364/550, 51.01, 578, 579, 580, 571.01; 324/73.1; 371/24, 25.1, 26-29.1, 71

[56] References Cited

U.S. PATENT DOCUMENTS

| | | | |
|---|---|---|---|
| 3,976,940 | 8/1976 | Chau et al. | 371/25.1 |
| 4,055,801 | 10/1977 | Pike et al. | 371/25.1 |
| 4,799,220 | 1/1989 | Nielsen | 371/25.1 |
| 4,821,217 | 4/1989 | Jackson et al. | 364/551.01 |
| 4,841,456 | 6/1989 | Hogan, Jr. et al. | 364/550 |

Primary Examiner—Gary Chin
Attorney, Agent, or Firm—Christensen, O'Connor, Johnson & Kindness

[57] ABSTRACT

An integrated certification-calibration system for a test system having multiple test instruments is disclosed. The system of this invention is used for certifying and calibrating processor-controllable test instruments that are arranged in at least two groups of separate test instruments, where each group has a separate system controller for controlling the test instruments associated therewith. The system of this invention includes a portable certification cart containing a number of processor-controllable certification instruments for certifying the various test instruments. Interconnection cables are provided for selectively interconnecting the individual groups of test instruments to the certification instruments and for connecting the system controllers associated therewith to the certification instruments. Each system controller has a certification executive that, when executed, controls both the test instruments associated therewith and the certification instruments so that certification tests are run on the test instruments. Test instruments that are processor-calibratable are calibrated by the system controller when they fail certification testing.

15 Claims, 8 Drawing Sheets

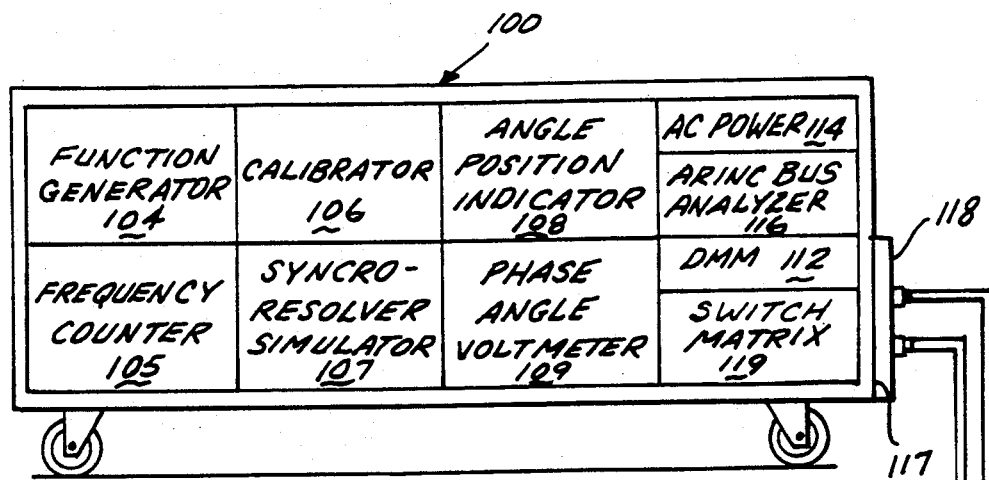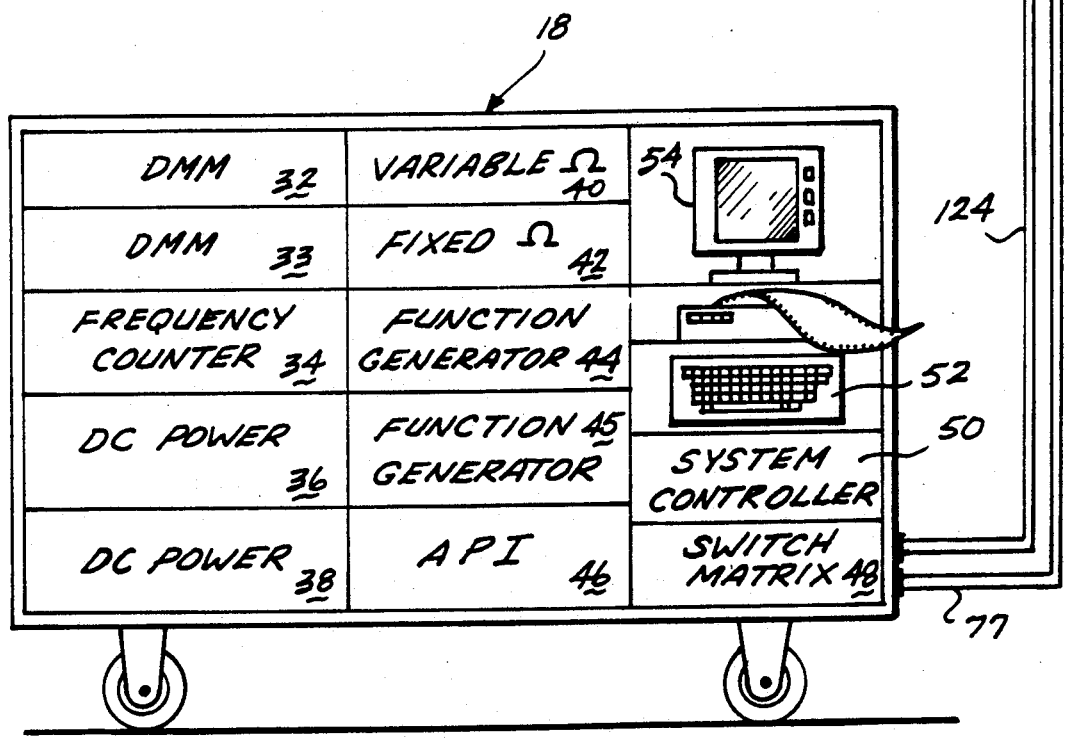
Fig. 2.

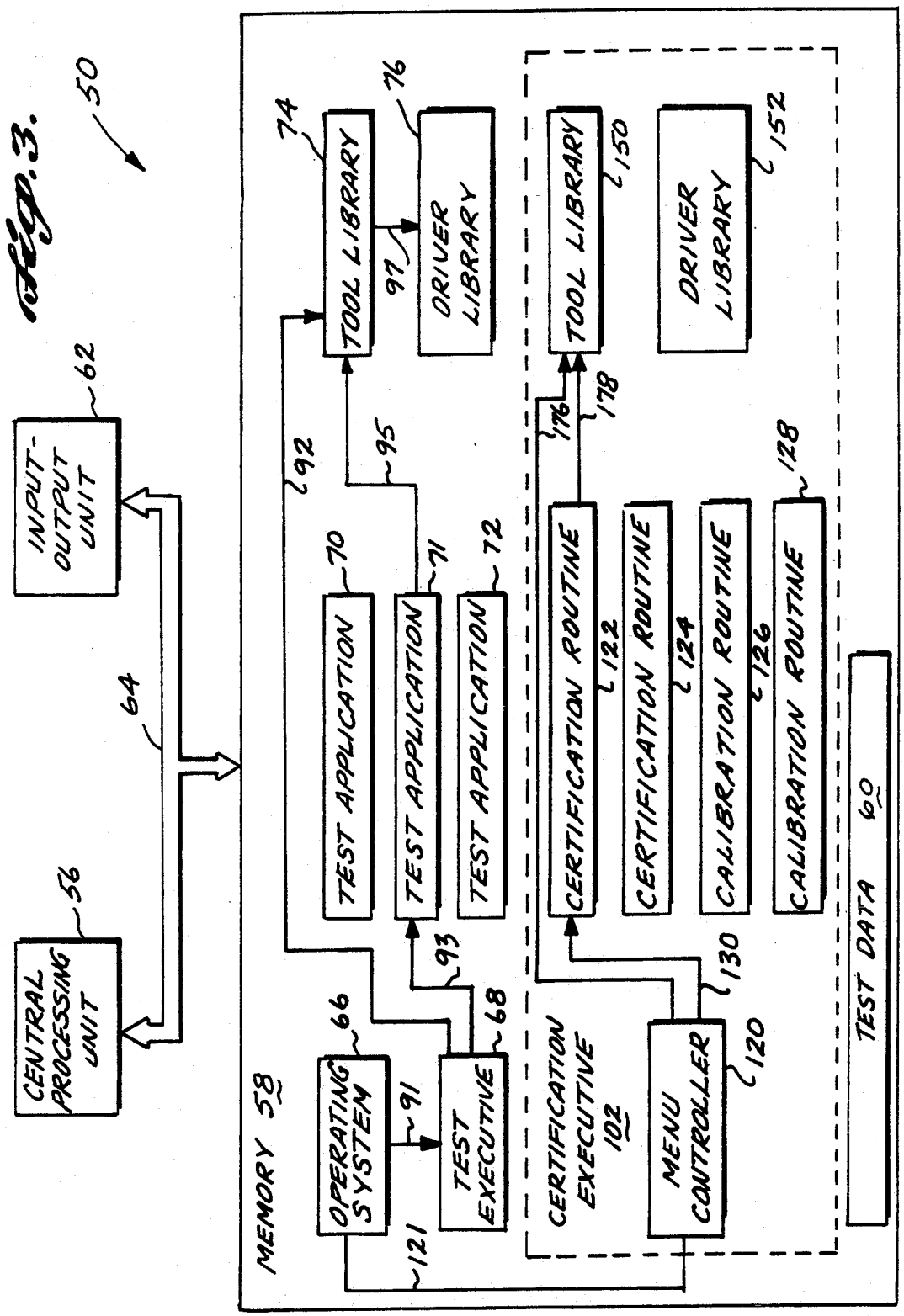

INTEGRATED CERTIFICATION-CALIBRATION SYSTEM FOR A TESTING SYSTEM HAVING MULTIPLE TEST INSTRUMENTS

This application is a divisional of application Ser. No. 07/467,781, filed Jan. 19, 1990.

FIELD OF THE INVENTION

This invention relates generally to the field of metrology, and, more specifically, to an integrated certification-calibration system for providing an indication of the accuracy of a number of different test instruments and for calibrating same.

BACKGROUND OF THE INVENTION

An integral part of functionally testing modern technical equipment is verifying, or certifying, that the test instruments used to make the functional tests operate properly and within their rated accuracy. Test instruments used to generate stimuli to equipment under test must be certified to ensure that the desired stimuli are, in fact, produced. Test instruments used to measure the response of equipment under test must be certified to ensure that equipment responses are accurately quantified or qualified. If either type of test instrument fails to function properly, the functional testing process in which the instruments are used may be faulty. The functional testing could produce test results indicating that a portion of some equipment is malfunctioning, when in fact, it is not, or alternatively indicating that a portion of the equipment operates properly when the opposite is true.

A process related to instrument certification is calibration. Calibration is the process of adjusting components on test instruments so that the instruments either deliver appropriate stimuli or make accurate measurements, and/or determining appropriate corrections to be applied to the instruments. Certification and calibration are usually performed together as an iterative process. If an instrument fails a certification test, it is calibrated. The instrument is then subjected to another certification test. In this manner, an instrument is repeatedly subjected to certification testing and calibrated until it either passes certification or is deemed unusable.

Calibrating and certifying the instruments used to functionally test aircraft and other complex equipment is a difficult task. An aircraft, for example, comprises a number of different systems, each of which is designed to perform a general function. Each system is usually made up of separate subsystems comprising numerous components designed to perform a specific task. Manufacturing, maintenance, safety, and regulatory requirements demand that the individual components and subsystems be subject to frequent and extensive functional testing. Functional testing of this nature requires a large number of, and different types of, test instruments. Each test instrument must be subjected to a specific calibration and certification process for each function the instrument performs to ensure that the instrument operates properly. Significant amounts of technician time are thus required to perform the individual calibration and certification processes. Moreover, the certification tests and calibrating adjustments performed on any individual instrument are inherently subject to technician error. The number of certification and calibration processes that must be performed on large numbers of test instruments used in some environments increases the likelihood that even the most conscientious technician may improperly calibrate and certify a given instrument.

In addition, one type of test instrument can have different certification requirements that depend on the specific system the instrument is used to test. An instrument may be calibrated and certified for test functions that are not involved in the particular functional testing for which the instrument will be used. At the least, this type of calibration and certification may simply result in excess time being spent certifying the instrument. At the worst, this type of calibration and certification can result in a test instrument being certified as operational when, in fact, it may not be so certified for the tests it is used to perform.

Instrument calibration and certification also requires that each time a test instrument is calibrated and certified, a record of the processes be made. Calibration and certification records are used for studying fault histories of the instruments so that the source of the faults can be identified and corrected. Calibration and certification records are also used for determining if a particular instrument has a fault pattern that indicates that the accuracy of the instrument for functional testing cannot be guaranteed. Regulatory authorities often require instrument certification records to be maintained so that the authorities can verify that only properly certified test instruments are used for functional testing.

Generating and maintaining instrument calibration and certification records contributes to the complexities of the calibration and certification processes. The time required to maintain a "paper trail" of each certification test adds to the time required to calibrate and certify each instrument. Human error can cause the results of any certification test to be either inaccurately entered or inaccurately transcribed.

SUMMARY OF THE INVENTION

This invention is a new and useful integrated certification-calibration system for verifying that test instruments perform properly. Should an instrument fail certification testing, the system calibrates the instrument until it passes certification. The system of this invention is able to automatically certify and calibrate different test instruments, and is further able to automatically subject a particular test instrument to the appropriate certification and calibration processes based on functional tests to be run with the instrument. The integrated certification-calibration system also generates and maintains records of each certification test performed on the test instruments.

The integrated certification-calibration system of this invention includes a portable certification cart with a number of remotely controllable and remotely readable certification instruments thereon. The system further includes groups of test instruments that are arranged together. A system controller, integral with each test instrument group, regulates the running of functional tests by the test instruments. In the system controller, a certification executive controls both the test instruments and the certification instruments. The certification executive contains a number of certification routines and calibration routines for certifying and calibrating the test functions of the test instruments.

When it is desirable to certify a particular instrument group, the certification cart instruments are connected to the test instruments and the system controller. A specific certification routine or calibration routine for the test instrument function to be certified is then invoked for execution by the system controller. Each certification routine contains a set of system controller-executable instructions for running certification tests on a particular test instrument. The certification routine also includes a set of instructions directing the system controller to write the results of the certification tests into memory.

Calibration routines similarly contain instructions directing the system controller to run certification tests on the test instruments and to write the test results into memory. The calibration routines also contain instructions that are invoked if the test instrument fails certification testing. These instructions control the test instrument components so as to adjust the operation of the instrument so it will operate properly. Further, the calibration instructions reinvoke the certification tests to determine if, as a result of the calibrating adjustments, the test instrument operates properly.

The certification-calibration system simplifies the certification and calibration of instruments used for functional testing. The certification and calibration routines run on the system controller for each group of test instruments perform the instrument certification and calibration with little or no technician assistance. The system thus minimizes the technician time required to certify the instruments, and substantially reduces the probability that human error will cause a particular instrument certification or calibration process to be performed inaccurately.

The certification and calibration routines for a test instrument group is designed to run only the certification and calibration procedures for the test instrument test functions used in the functional testing that the group performs. This approach ensures the appropriate test functions of each test instrument in the group are calibrated and certified. Moreover, needless certification testing and calibration of unused test functions of the test instruments in each instrument group are eliminated.

Another advantage of this system is that new certification and calibration routines with additional or substituted certification procedures for the test instruments can be readily entered into the system controller. Whenever the test instrument test functions used for a particular set of functional tests change, new certification or calibration procedures for the updated functions are simply loaded into the system controller. This capability eliminates the need to teach technicians new certification or calibration procedures each time instrument test functions used in the functional testing change. Furthermore, since the certification and calibration routines are associated with the instrument groups rather than the certification cart, there is no need to take the cart out of service each time it is necessary to update the routines.

A further advantage of this system is that the results of certification testing are automatically recorded and maintained by the system controller. Technician time and administrative overhead required to generate and maintain a paper trail of certification and calibration records for each instrument are essentially eliminated. Since the recording and archiving of the certification test results are performed automatically, the possibility that human error can cause inaccurate certification records to be archived is similarly eliminated.

BRIEF DESCRIPTION OF THE DRAWINGS

The invention will be pointed out with particularity in the appended claims. The above and further advantages of the invention may be better understood by referring to the following detailed description taken in conjunction with the accompanying drawings in which:

FIG. 2 is a block diagram of an automated test equipment cart and a certification cart that is part of the integrated calibration system of FIG. 1;

FIG. 3 is a block diagram of a system controller of an automated test equipment cart of FIG. 2 wherein individual routines that control the certification and calibration of instruments on the automatic test equipment cart in accordance with this invention are depicted as separate modules;

DETAILED DESCRIPTION OF THE PREFERRED EMBODIMENT

Figure 1:
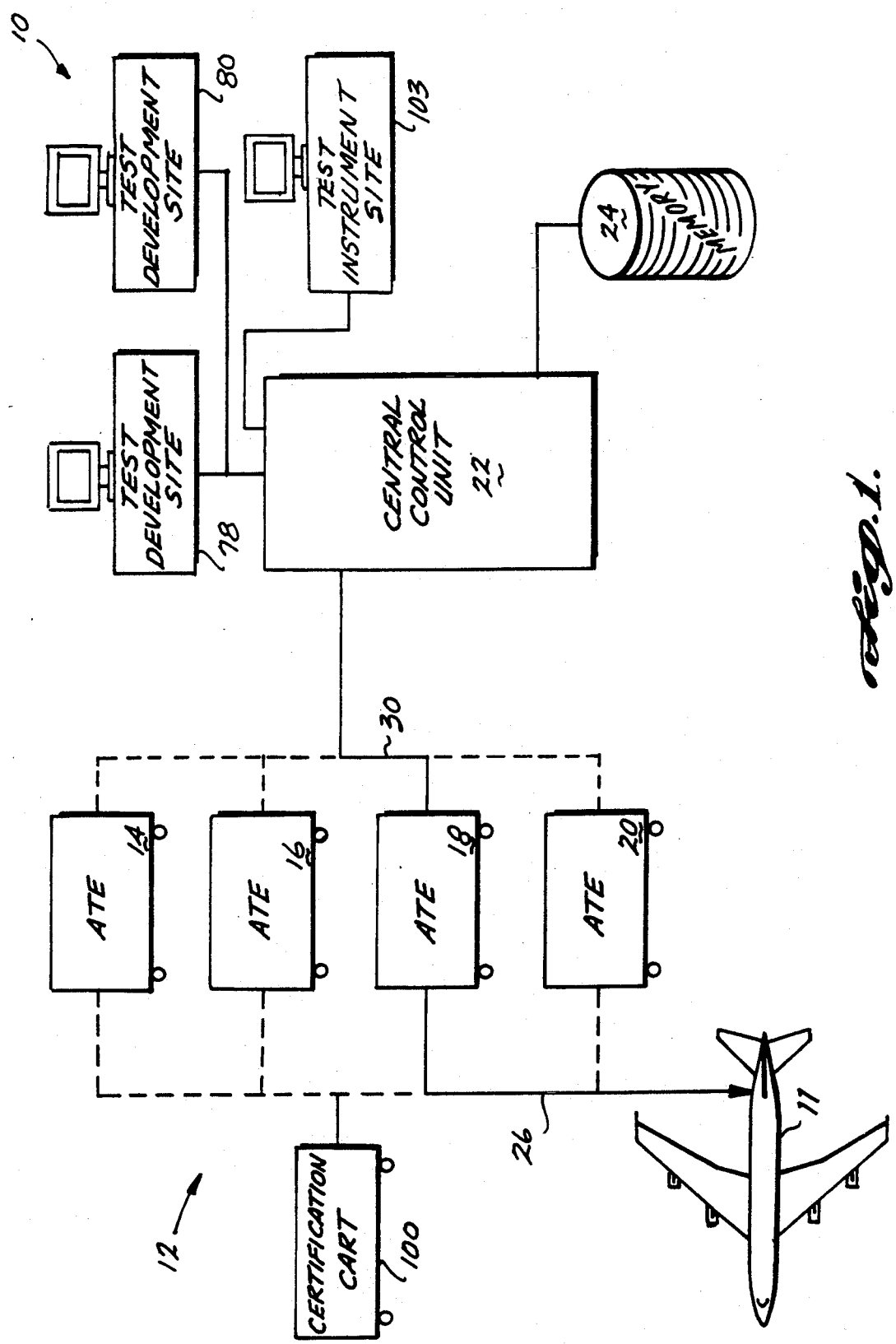
FIG. 1 is a general diagrammatic block diagram of an integrated test system incorporating a calibration system constructed in accordance with the invention.

FIG. 1 depicts an integrated test system 10 for performing functional tests on an aircraft 11, which includes a certification-calibration system 12 constructed in accordance with this invention to verify the accuracy of test instruments used on the aircraft 11. The integrated test system 10 includes a number of automated test equipment carts (ATEs) 14, 16, 18, and 20, each of which contains test instruments for functionally testing a specific system on the aircraft 11. A central control unit 22, a main computer, is provided for selectively loading programs and information into the ATEs 14-20, and for retrieving information therefrom. Information retrieved from the ATEs 14-20 is stored by the central control unit 22 in a memory file 24 from which the information can be selectively accessed.

Each ATE 14-20 carries a number of test instruments that are designed to provide input stimuli or make measurements that are required to test specific components and subsystems on the aircraft 11. Specifically, ATE 14 includes test instruments for testing the flight controller system of the aircraft 11; ATE 16 includes test instruments for testing the avionics system of the aircraft 11; ATE 18 includes test instruments for simulating the engines of the aircraft so that the engine systems can be tested; and ATE 20 includes power supplies for testing the electrical and power systems of the aircraft 11. As depicted by communications link 26, shown partially in solid and partially in phantom, each ATE 14-18 or 20 is selectively connected to the aircraft 11 so that the tests performed by the ATE can be run. As the testing of aircraft 11 progresses, the connected ATE 14-18 or 20 internally stores the results of the tests. After an ATE 14-18 or 20 is used to run tests on one or more aircraft 11, the ATE is then connected to the central control unit 22 by a communications link 30, shown partially in solid and partially in phantom. The central control unit 22 then retrieves the test information for the aircraft 11 from the ATE permanent memory 24. The ATEs 14-20 can be used to run tests on specific systems in the aircraft 11 at any time during the manufacture of the aircraft, or during subsequent maintenance inspections.

Referring to FIG. 2, engine simulator ATE 18 (and test instruments 32-46 included therein) are shown and described below as being representative of each of the ATEs 14-20. The ATE 18 includes two digital multimeters 32 and 33, respectively, for measuring resistances, voltages, and currents. A frequency counter 34 provides a measure of the output frequency of any pulse or AC signals that are required. A first DC power supply 36 provides an output voltage between 0.5 and 10 volts DC, and a second DC power supply 38 provides an output voltage between 0.5 and 50 volts DC. A variable programmable resistor 40 provides loads ranging from 25 to 20,000 ohms. A set of load resistors 42 provide commonly used fixed load resistances. Function generators 44 and 45 provide a source of variable shape and frequency AC signals. An angle position indicator 46 provides an indication of mechanical angular displacement based on the relative voltages of two input signals. Each test instrument 32-46 is processor controllable. In other words, these test instruments 32-46 that make measurements do so in response to commands transmitted over digital data processing communication links and report the results of the measurements over the communication links. Test instruments 32-46 that generate stimuli do so in response to commands received over digital data processing communication links.

Test instruments 32-46 are connected to aircraft 11 over one or more signal interface cables 47. The head of the signal interface cable 47 has a number of individual pin connectors, not illustrated, that provide conductive links to individual circuits on the aircraft 11. A switch matrix 48 on ATE 18 provides interconnections between terminals on the test instruments 32-46 and the individual signal interface cable pins. Switch matrix 48, like the test instruments 32-46, is processor controllable.

The ATE 18 has a system controller 50 that directs the operation of the individual test instruments 32-46. System controller 50 has a keyboard-printer 52 for bi-directionally loading instructions and data, and a display touch screen 54 for display and input of information. The touch screen allows a technician to enter instructions and information into the controller 50 by simply touching the face of the display 54 on which a menu of selections is provided.

FIG. 3 depicts the basic processor elements of the ATE 18 system controller 50. A central processing unit 56 controls the control operation of the ATE 18 in response to sets of program instructions. A memory 58 is provided for storing program instructions used to run the ATE and also test data 60 developed as a consequence of running the ATE 18. The system controller 50 also has a number of input and output units, represented by block 62, so that the system controller 50 can exchange instructions and data with other elements of the integrated test system 10. Specifically, the input-/output units 62 provide for information exchange with the aircraft 11, the central control unit 22, the test instruments 32-46, the keyboard printer 52, the display touch screen 54, and a certification cart 100 (FIG. 1) to be described hereinafter. One or more communication buses 64, one shown, connected between the central processing unit 56, the memory 58, and the input/output units 62 allow for the exchange of information therebetween.

The specific programs that control the operation of the ATE 18 are depicted as modules inside the system controller memory 58. An operating system 66 serves as a housekeeping controller for the ATE 18. The operating system 66 controls the operation of the ATE 18 when first initialized, and is used to store and maintain operating information maintained by the ATE 18. An example of the type of information that the operating system 66 maintains is the serial numbers of the instruments 32-46 that are in the ATE 18. A test executive 68 controls the test instruments 32-46, and allows a technician to manually control same. The ATE 18 is also controlled by a number of test applications 70, 71, and 72. Each test application 70-72 is a set of system controller-executable instructions that causes ATE 18 to automatically perform a specific functional test on a component or subsystem of aircraft 11. Test applications 70-72 include instructions that direct the results of the functional testing to be written into the memory 58 as test data 60.

System controller 50 also includes a tool library 74 and a driver library 76. Tool library 74 contains a number of instrument tools (not depicted), each of which is a set of general instructions for performing a specific task with a test instrument 32-48 or the switch matrix 49. Driver library 76 contains a number of individual drivers (not depicted), that are specific instructions responded to by test instruments 32-48 and the switch matrix 49. Tools are invoked for execution by the test executive 68 or by test applications 70-72 to perform a general instrument-related task. Drivers are invoked by the tools to actually manipulate the appropriate test instruments and the switch matrix.

After system controller 50 is initialized, operating system 66 (FIG. 3) invokes test executive 68 to run ATE 18 as represented by arrow 91. The test executive 68 can then be used by the technician to control the test instruments 32-46 and switch matrix 48 by directly invoking, as represented by arrow 92, directed to the tool library 74. Alternatively, test executive 68 can be used to invoke one of the test applications that automatically performs a functional test, as represented by arrow 93, directed to test application 71. Test application 72 then accesses the tool library 74, as represented by arrow 95, so that appropriate instrument tools for the desired functional test are invoked. The invoked instrument tools execute the appropriate instrument drivers as represented by arrow 97. Test application 71 also directs the test results to be written into memory 58 as test data, connection not shown.

The test executive 68, the test applications 70-72, the tool library 74 and the driver library 76 are collectively developed at test development sites 78 and 80 (FIG. 1), which are connected to the central control unit 22. The programs 68-76 are downloaded into the ATE system controller 50 through the central control unit 22. The central control unit 22 also maintains a copy of the programs 66-84 in memory file 24.

When the ATE 18 is used to test a specific subsystem of the aircraft 11, the ATE is connected to the aircraft by the signal interface cable 47. One or more of the test applications 70, 71 or 72 can then be selectively run on the system controller 50 so that the ATE 18 will, in turn, automatically perform functional tests on the aircraft 11. Any functional test of the aircraft 11 may involve the generation of one or more stimulus signals for input into the aircraft and monitoring a response to the stimulus from one or more output lines. The results of the test are then stored as test data 60 in the memory 58. After the testing of the aircraft 11 is completed, the ATE 18 may be connected to the central control unit 22 by communications link 30. The central control unit 22 copies the test data 60 from the memory 58 into the storage file 24 to permanently archive the test results for future reference.

The other ATEs 14, 16, and 20 function in the same general manner as ATE 18. Each ATE 14-20 has a different set and number of test instruments 32-48 designed to run functional tests on the components and subsystems comprising a specific system of the aircraft. The programs 66-84 running on each ATE 14-20 are custom designed for the specific functional tests performed by the ATE and the test instruments thereon.

The integrated certification-calibration system 12 of this invention is used to certify that ATE test instruments 32-46 operate within the performance levels required to run functional tests on the aircraft 11. Test instruments 32-46 that are designed to apply an input stimulus to the aircraft 11, for example function generators 44 and 45, are checked to certify that the instruments generate the desired signals. Test instruments 32-46 that quantitatively measure signals from the aircraft 11, for example digital multimeters 32 and 33, are checked to certify that they provide accurate measurements. The integrated calibration system 12 includes the portable certification cart 100 (FIG. 1) that contains a number of certification instruments 104-116. System 12 also includes a certification executive 102 that is run on system controller 50 (FIG. 3). Certification executive 102 controls both the test instruments 32-46, and certification instruments 104-116 so that the latter automatically certify the former. Certification executive 102 also contains instructions that direct the system controller 50 to calibrate or adjust test instruments 32-46 that fail certification testing. A test instrument site, represented by terminal 103, which is connected to the central control unit 22 is also provided. The test instrument site terminal 103 is located in a test instrument repair facility allows instrument technicians to review and update the records of instruments used for functional testing.

With this background, the integrated certification-calibration system 12 may be better understood by reference to FIG. 2, which depicts the certification cart 100 and certification instruments 104-116 thereon. Certification cart 100 has both a function generator 104 and frequency counter 105. A calibrator 106 serves as a very precise voltage and resistance source. A syncroresolver simulator 107 generates signals that simulate those normally received by an angle-position indicator. Certification cart 100 also has an angle position indicator 108. A phase angle volt meter 109 provides phase angle and voltage measurements. Certification cart 100 further carries a DMM 112. There is also an on-cart ARINC bus analyzer 116 which is used to monitor digitally encoded data exchanged between aircraft internal components and the ATEs 14-20. Each of the certification cart instruments 104-116 is like test instruments 32-46, processor controllable.

An on-cart receiver board 117 and a removable interface test adapter 118 facilitate the interconnection of the test instruments 32-46 and certification instruments 104-116. The certification instruments 104-116 are each connected to terminals, not shown, on the receiver board 117. The interface test adapter 118 connector is designed for connection at one end to the receiver board 117 terminals. The other end of the interface test adapter 118 has a socket, not illustrated, to which ATE 18 signal interface cable is connected. When an ATE 14, 16 or 20 having a different type of signal interface cable is connected to the certification cart 100, an interface test adapter with the appropriate complementary signal interface cable socket is attached to the receiver board 117. A processor controllable switch matrix 119 controls the interconnections of certification instruments 104-116 to the receiver board 117 terminals.

An instrument bus 124 attached to ATE 18 provides a path for the exchange of digital data processing signals between the ATE system controller 50 and the certification instruments 104-116 and the switch matrix 119. In the depicted embodiment, instrument bus 124 is coupled into a complementary socket, not illustrated, on the interface test adapter 118. The interface test adapter 118, the receiver board 117 and the certification cart 100 are each provided with appropriate terminals and conductors that establish digital data processing signal paths between the certification instruments 104-116 and the instrument bus 124.

Certification executive 102 includes a menu/controller 120 that runs on the system controller 50 as depicted in FIG. 3. As represented by arrow 121, operating system 66 calls menu/controller 120 for execution when certification executive 102 is first invoked. Menu/controller 120 can be used by technicians to manually control test instruments 32-46, certification instruments 104-116, and switch matrices 48 and 119. The menu/controller 120 also allows the technician to store or retrieve test results 60.

Certification executive 102 also includes a number of certification routines 122 and 124 and calibration routines 126 and 128 that are system controller 50-executable instructions used in performing certification and calibration procedures on test instruments 32-46. Individual certification routines 122 and 124 and calibration routines 126 and 128 are executed by system controller 50 in response to invocation calls made by menu/controller 120 as represented by an arrow 130 directed to certification routine 122. Certification routines 122 and 124 are run to certify test instruments 32-48 that are not adapted to be remotely calibrated. Calibration routines 126 and 128 are run to certify and calibrate test instruments 32-48 that are capable of being remotely calibrated. In the described embodiment of the system 12, only two certification routines 122 and 124 and two calibration routines 126 and 128 are shown. However, it is readily understood that the system controller 50 has as many certification and calibration routines 122-128 as are required to certify and calibrate the test instrument test functions used during the functional testing performed by ATE 18.

Figure 4A:
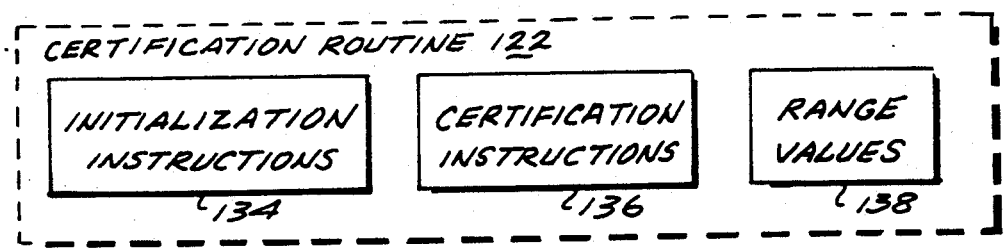
FIGS. 4a-b are block diagrams that show the subparts of a certification routine and a calibration routine of this invention as separate modules.

Certification routine 122 is represented in greater detail in FIG. 4a as being representative of the certification routines 122 and 124. The certification routine 122 contains a set of initialization instructions 134, a set of certification instructions 136, and a set of range values 138. Initialization instructions 134 direct system controller 50 to prepare ATE 18 and certification cart 100 for certification and calibration procedures. For example, initialization instructions 134 direct the system controller 50 to generate a number of messages on display touch screen 54 that direct and inform the technician what preparatory steps need to be taken prior to performing the certification process on any test instrument 32-48. The initialization instructions 134 may, for example, include instructions to turn on selected certification instruments 104-116.

Certification instructions 136 are executed by the system controller 50 to perform the certification of the test instruments 32-46 or 48. The certification instructions 136 are the instructions that control the test instruments 32-48, the certification instruments 104-116, and switch matrices 48 and 119 so that the test instrument can be certified. During the running of the certification instructions 136, the range values 138 are referenced to obtain the acceptable performance standards for the function of the instrument being tested, within which the instrument must operate in order to be considered certified. For example, when the resistance measuring functions of DMMs 32 and 33 are tested against a 100 ohm standard, the acceptable indicated resistance for the multimeters should be between 98.5 and 101.5 ohms.

Figure 4B:
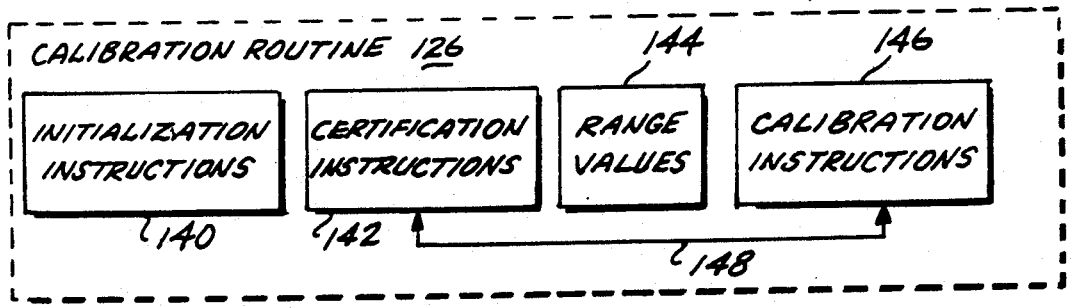

Calibration routine 126 is depicted in greater detail in FIG. 4b as being representative of the calibration routines 126 and 128. The calibration routine 126 contains initialization instructions 140, certification instructions 142, and range values 144 that are the same as the initialization instructions 134, the certification instructions 136, and range values 138 of certification routine 122. Calibration routine 126 includes a set of calibration instructions 146 that are executed by system controller 50 to calibrate a test instrument 32-45 or 46. As represented by bidirectional arrow 148, calibration instructions 146 are invoked in response to an indication that the test instrument failed certification testing. After the calibration instructions 140 are executed, the certification instructions 142 are then reinvoked to determine if the calibration process was successful.

It should be understood that in the foregoing description, depiction of the initialization instruction 134 and 140, the certificaton instructions 136 and 142, the range values 138 and 144, and the calibration instructions 146 as separate modules was for the purposes of illustration only. In any particular certification or calibration routine 122-126 or 128, the separate subsets of instructions that comprise the routine may be integrated together as necessary. For example, the range values 138 and 144 are typically integrated into the associated certification instructions.

Figure 5:
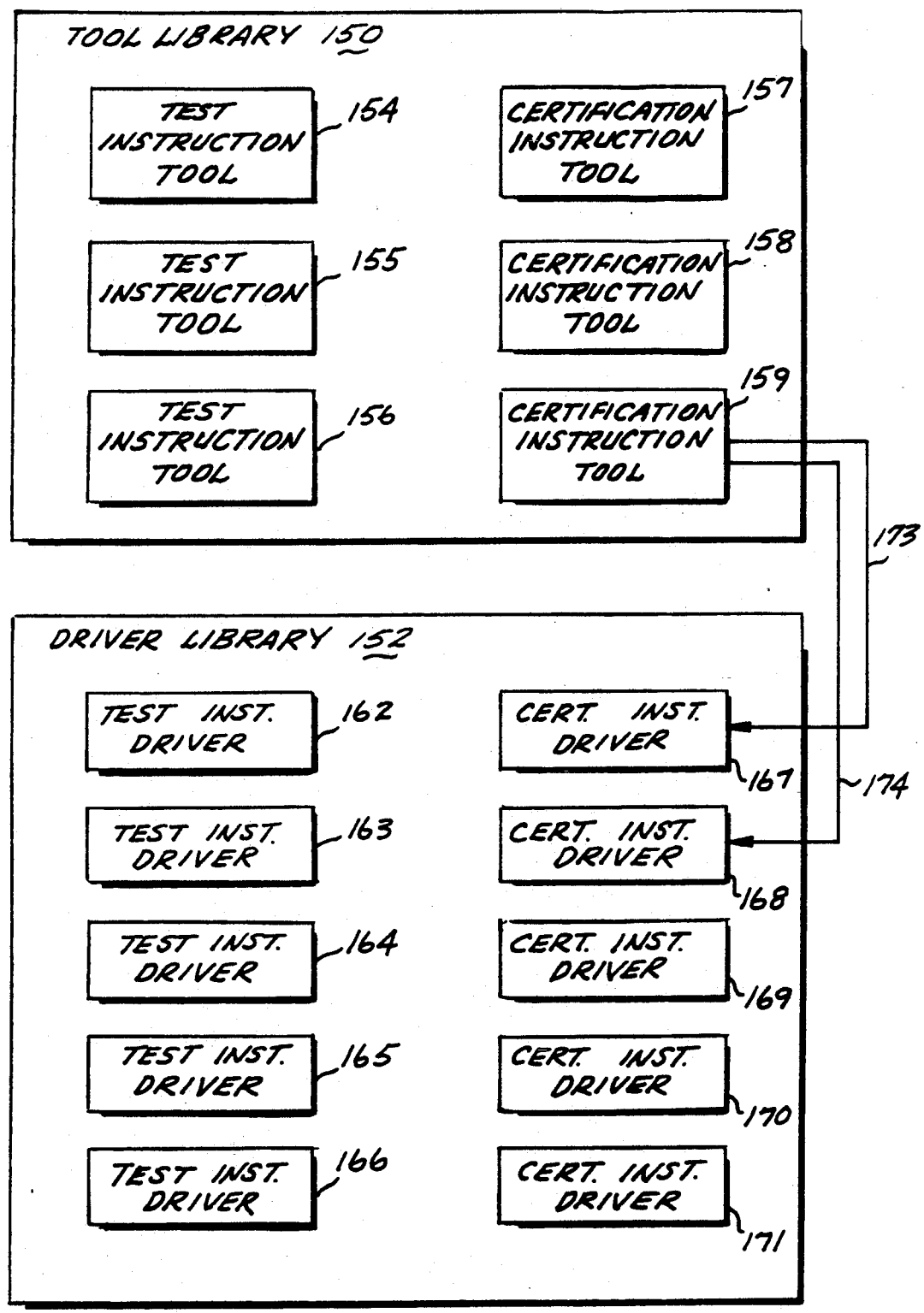
FIG. 5 is a block diagram of the tool library and driver library of the certification executive depicted in FIG. 3, wherein individual tools and drivers that control the test instruments and certification instruments in accordance with this invention are depicted as separate modules.

Certification executive 102 also contains a tool library 150 and a driver library 152, both depicted in greater detail in FIG. 5. Tool library 150 contains a number of instrument tool 154-156, each of which is a general set of instructions for performing tasks with either the test instruments 32-48, the certification instruments 104-116, or the switch matrices 48 and 119. Instrument tool 154, for example, is a set of general instructions that direct DMM 32 on the ATE 18 to make a resistance reading. Instrument tool 159 is a set of general instructions that directs the certification cart 100 function generator 104 to generate a particular type of AC signal. The instrument tools 154-156 that control the ATE test instruments 32-48 and switch matrix 48 are identical to the instrument tools in the tool library 74 as accessed by the test executive 68 and test applications 70-72.

Driver library 152 contains a number of individual drivers 162-166 that are specific instructions responded to by the test instruments 32-48, the certification instruments 104-116, and switch matrices 48 and 119. Drivers 162-164, for example, contain instructions to which ATE 18 DMM 32 responds. Drivers 167-169 comprise instructions certification cart 100 function generator 104 responds to. For example, driver 167 may be an instruction to function generator 104 to generate a square wave; driver 168 may be an instruction to generate an output signal at a given frequency. When an instrument tool 154-159 is invoked for execution, the tool, in turn, invokes one or more drivers 162-171 to manipulate the particular instrument or switch matrix. For example, when function generator tool 159 is invoked, the tool invokes driver 167 to direct the function generator 104 to generate a square wave, as represented by arrow 173. Instrument tool 159 then invokes driver 168, as represented by arrow 174, to generate a square wave at a specific frequency. While only a limited number of instrument tools 154-159 and drivers 162-171 are shown, it should be recognized that tool library 150 and driver library 152 contain a sufficient number of tools and drivers to manipulate all of the test instruments 32-48, the certification instruments 104-116, and the switch matrices 48 and 119 as is required.

As depicted by arrows 176 and 178 in FIG. 3, the menu/controller 120 and the certification and calibration routines 122-128 are each capable of accessing tool library 150 to control the operation of a particular test instrument 32-46, certification instrument 104-118, or switch matrices 48 and 119. Each instrument tool 154-159 invoked then executes the appropriate driver 162-171, as required.

Figure 6:
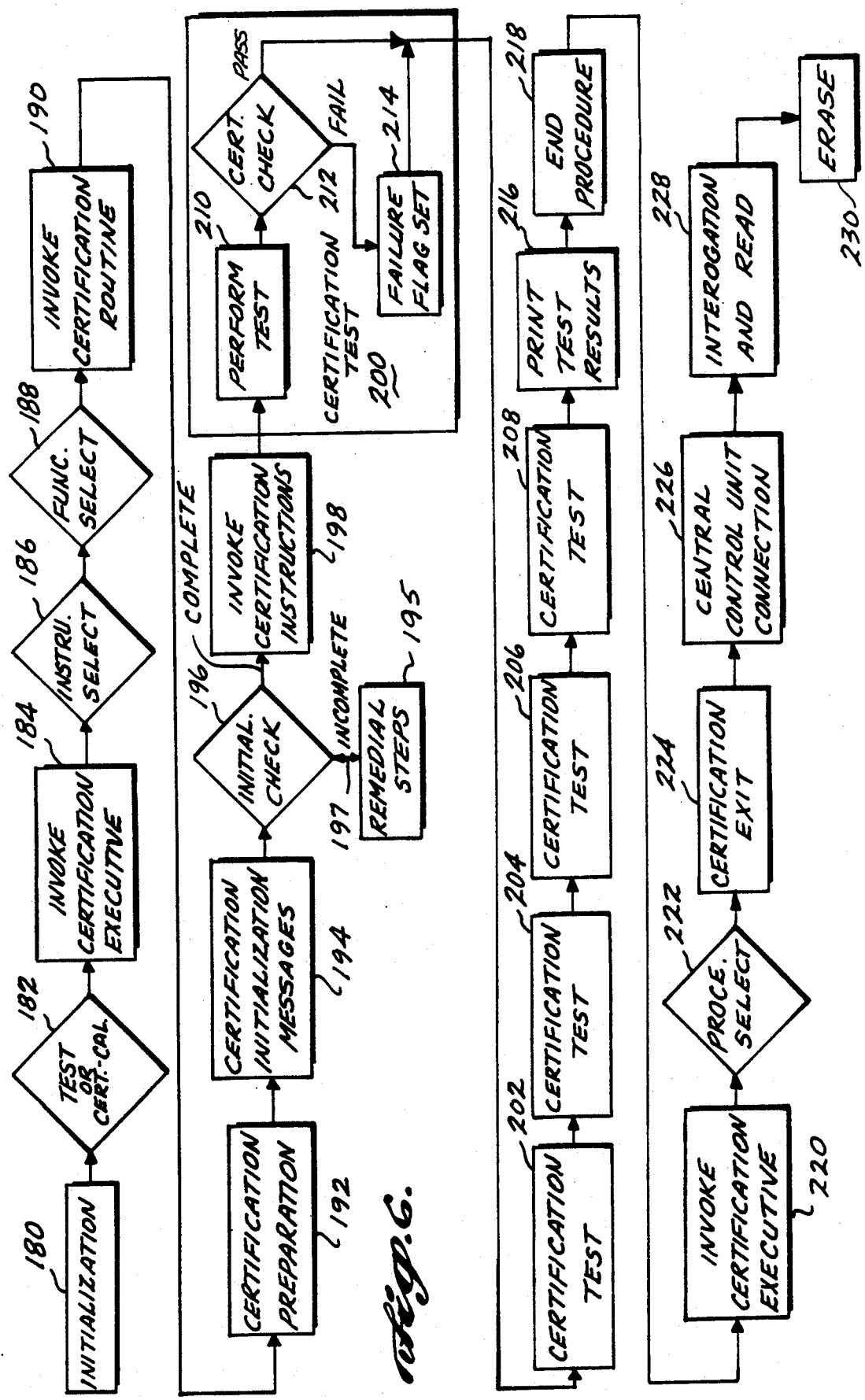
FIG. 6 is a flow chart or process diagram of how an instrument certification procedure is performed in accordance with the instructions contained in a certification routine of this invention.

FIG. 6 depicts in block diagram form how ATE test instruments 32-48 are certified using this integrated calibration system 12. Certification starts with the "boot-up" or initialization step 180 of the ATE system controller 50. Initialization 180 is performed automatically by the system controller 50 in response to a set of instructions contained in the operating system 66.

During initialization 180, and throughout the certification procedure, system controller 50 generates messages on the display touch screen 54 informing the technician of what steps need to be taken during the certification process. The messages may instruct the technician to indicate that he has performed the required tasks by generating a "step-completed" message. The step-completed message is used by the system controller 50 as a signal to proceed with the execution of the program running the ATE 18 and the certification cart 100. The step-completed message is normally transmitted to system controller 50 by the technician touching a section on the face of display touch screen 54. Menus offering the technician choices during the testing process and responses to these menu choices are similarly exchanged through display touch screen 54.

At the end of initialization 180, the system controller generates a menu 182 informing the technician of the procedures the ATE 18 is able to perform. The procedures the ATE 18 can perform are: TEST procedures, wherein ATE 18 can be used in a test mode to perform functional tests on a specific system on the aircraft 11, and, CERTIFY-CALIBRATE procedures, wherein the ATE is run in a certification mode to certify or calibrate the test instruments 32-48. To prevent the unauthorized invocation of the certification and calibration routines, a password must be entered with this selection before the system controller 50 will proceed with this procedure (password entry step not shown).

If the CERTIFY-CALIBRATE procedures option is selected, the certification executive 102 is invoked for execution 184 by operating system 66. The menu/controller 120 is initially executed and directs the system controller 50 to generate a menu 186 allowing the technician to select the ATE instrument 32-45 or 46 to be certified. After a particular test instrument 32-45 or 46 is selected, a second menu 188 may then be generated requesting the technician to select the function of the selected instrument to be certified or calibrated. For example, if a technician selects DMM 32 for certification, a second menu directs the technician to select the DC voltage, the AC voltage, the resistance, or the current measuring capability of the meter for certification. Menu/controller 120 also allows the technician to select a manual testing mode, not illustrated, wherein the technician can directly control the test instruments 32-48, the certification instruments 104-116, and switch matrices 48 and 119 through the system controller 50.

In response to the selection of the specific test instrument 32-45 or 46 and instrument function to be certified, the system controller 50 performs an invocation step 190 and calls the appropriate certification or calibration routine 122-126 or 128. In the depicted process, certification routine 122, a DC voltage certification routine used to certify the DMM 32, is invoked for execution. The initialization instructions 134 are the first part of routine 122 executed. The initialization instructions 134 direct system controller 50 to execute a preparation step 192 that readies the ATE 18 and the certification cart 100 for the actual certification process. The preparation step 192 includes placing the test instrument and appropriate certification instruments 104-116 in the appropriate state for certification of the test instrument. Certification initialization instructions 134 in certification routine 122 includes instructions to prepare DMM 32 to take voltage measurements and to prepare the certification cart 100 calibrator 108 to generate precise voltages. The DMM 32 and the calibrator 108 are manipulated for the certification process by execution of the appropriate instrument tools 159-161 and drivers 162-171.

Initialization instructions 134 may also direct system controller 50 to generate messages 194 informing the technician of the steps necessary for the certification process to proceed. The messages may, for example, include instructions directing the technician to turn on and set selected test instruments 32-46 and selected certification instruments 104-116, and to make appropriate signal interface cable 48 and instrument bus 124 connections between the ATE 18 and the certification cart 100.

System controller 50 then performs an initialization complete check 196. Initialization complete check 196 comprises a number of internal self tests that verify that the certification procedure can be run. The internal self tests include verifying that the appropriate connections have been made between the ATE 18 and the certification cart 100. The self tests also include verifying that the certification instruments 104-116 are set to the appropriate states for the certification of the test instrument 32-45 or 46. If the initialization self checks indicate an unsuccessful initialization, remedial initialization steps 198 are performed. Remedial steps 195 include additional internal commands to the test instruments 32-44 or the certification instruments 104-116 to place the instruments in the proper state for the certification process. Remedial steps 195 further include generating messages directing the technician to perform the necessary corrective processes to place the ATE 18 and the certification cart 100 in a preparatory state for the certification process. As the remedial steps 195 are performed, the initialization self check 196 may be concurrently performed therewith as represented by a bi-direction arrow 197.

After the results of the initialization self test 196 indicate that the certification procedure can proceed, system controller 50 performs an invocation step 198 that calls the certification instructions 136 for execution. The certification instructions 136 direct the system controller 50 to perform a number of certification tests represented by blocks 200-208.

As illustrated by way of example for certification test 200, each certification test includes a perform test step 210. The perform test step 210 for the initial certification test 200 includes setting the switch matrices 48 and 119 so that the test instrument being certified is connected to the appropriate certification instruments 104-116. The perform test step 210 for the initial certification test 200 and each of the subsequent certification tests 200-208 includes making a certification test and storing the results of the test in memory 58 as test data 60. When the DC voltage measurement function of DMM 32 is tested, the initial perform test step 210 is made by supplying a standard or reference 0.5 volt DC signal from the calibrator 110 to the DMM 32 or 33 for measurement by the latter.

After the perform test 210, a certification comparison 212 is carried out. Certification comparison 212 includes the step of comparing the results of the certification test 210 to the range values 138 for the test to determine whether the involved test instrument 32-45 or 46 functions within allowable limits so that it can be considered certified for the purposes intended. The certification comparison 212, which follows the 0.5 DC volt perform test 210, comprises the step of determining if the multimeter made a DC voltage measurement of between 0.49 and 0.51 volts DC.

If the certification comparison 212 indicates that the test instrument was not functioning within its rated tolerance, a flag set step 214 is performed. Flag set step 214 comprises the setting of one or more flags indicating that the test instrument being certified failed the certification test 200. The flag set may include a message on either the keyboard-printer 52 or the display touch screen 54. The flag set step 214 may also include setting an internal flag within the system controller 50. For example, a flag may be set by the operating system 66 indicating that the particular instrument failed the certification test 200. Depending on the construction of the operating system 66, the system controller 50 may, in response to the set failure flag, inhibit use of the test instrument during functional testing.

After each certification test is complete, for example certification test 200, the certification procedure proceeds to the next certification test 202. The next performed test step is performed at a different instrument performance level than the previous perform test step 210 and the certification comparison is between a different range of tolerance values than those in certification comparison 212.

The number of certification test steps 200-208 performed by a particular certification routine 122 or 124 depends on the particular certification requirements of the function of the test instrument 32-45 or 46 being certified. The DC voltage measurement function of the DMM 32 is tested at 0.5, 1, 2, 3, 10, 28, 50, 100, 150, 200 and 250 volts. The DMM 32 is also certified for appropriate negative voltages in addition to the above-listed positive voltages. These certification tests verify that the voltmeter is measuring voltage signals within its rated accuracy throughout the range that the meter is used.

Certification tests 200-208 are also performed at levels and using functions provided by the particular test instrument 32-45 or 46 when it is used on the specific ATE 14, 16, 18, or 20. Test instruments 32-46 that generate stimuli signals are subjected to certification tests 200-208 at commonly used output levels. Test instruments 32-46 that measure output signals are subjected to certification tests 200-208 at signal levels the instruments commonly measure during the testing process. The DMM 32 on the engine simulator ATE 18, for example, is frequently used to test a 28 VDC signal on the aircraft 11 engine system. Accordingly, certification procedure 122 for DMM 32 includes a certification test to verify that the meter can accurately measure 28 VDC.

At the conclusion of the perform test step for the last certification test 208 (perform test step not illustrated), the switch matrices are opened so that the test instrument 32-45 or 46 is disconnected from the certification instruments 104-116. This minimizes the possibility that a spurious signal may damage any of the instruments 32-46 or 104-116.

After certification tests 200-208 have been completed, there is a print step 216 during which the test results are printed on the keyboard-printer 52. The printed results typically take the form of a header message identifying the specific test instrument 32-45 or 46 tested and the particular test function of the instrument tested. The message includes a listing of the particular level at which the instrument was tested, the results of the test, and the rated tolerance range for the instrument at that level. A flag message indicating that the test instrument 32-46 or 48 failed a particular certification test 200-206 or 208 is also printed out with the results of the certification test. Alternatively the certification test results may be printed as part of the perform test steps.

After certification tests 200-208 have been run, certification routine 122 performs an end procedure 218. End procedure 218 comprises generating a message informing the technician that the certification process performed by the routine has been completed. An invocation step 220 recalling the menu/controller 120 is then reinvoked to run the ATE 18 and the certification cart 100 is then performed.

A menu 222 is generated, offering the technician a selection of procedures that can next be performed. The procedures that can next be performed includes: re-executing the just performed routine 122 or another test function of the same test instrument 32-45 or 46; certifying or calibrating another test instrument; or, leaving the CERTIFY-CALIBRATE mode. If the latter option is selected, a certification exit step 224 is performed. The certification exit step 224 includes the generation of messages instructing the technician how to unhook ATE 18 from certification cart 100 and the invocation of the operating system 66 to control the ATE 18.

The certification procedure depicted in FIG. 6 also includes unloading the results of the certification tests 200-208 to central control unit 22 for archival in storage file 24. The unloading of the test results begins by connecting the ATE 18 to the central control unit 22 by way of the communications link 30, represented by block 226. After the ATE 18 and the central control unit 22 are interconnected, the central control unit 22 interrogates and reads in block 228 the test data 60 from system controller memory 58. During the interrogation and read 228, the results of certification tests 200-208 from executed certification and calibration routines 122-128 that are stored in the memory 58 are copied into the storage file 24.

Figure 7:
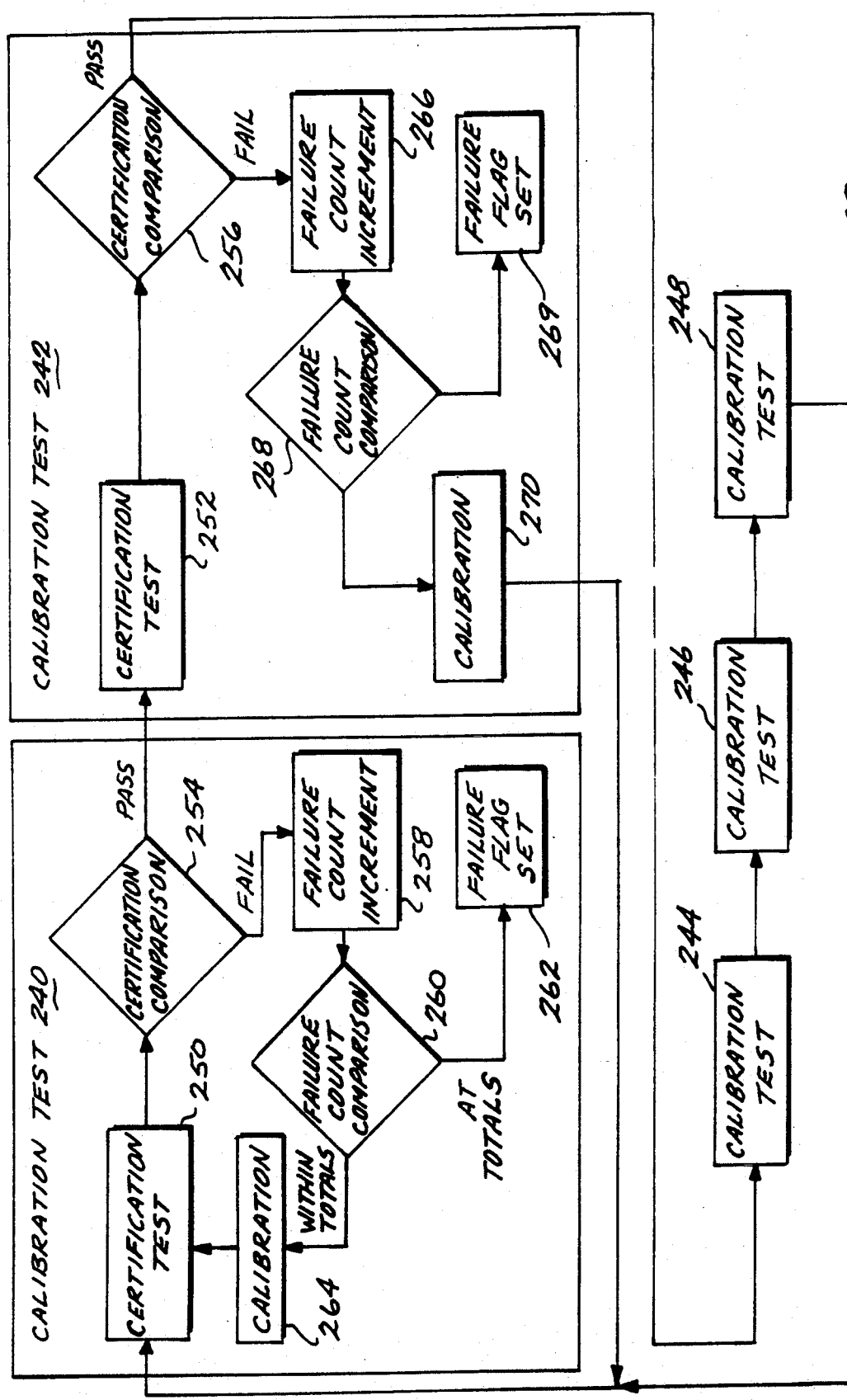
FIG. 7 is a flow chart or process diagram of how an instrument certification and calibration procedure is performed in accordance with a certification and calibration routine of this invention.

FIG. 7 depicts in block diagram form how a calibration routine 126 is invoked to calibrate a test instrument, for example, function generator 44. The initial steps of the calibration procedure, including invocation of the calibration routine 126, are identical to steps 180-198 performed during execution of the certification routine 122 described with reference to FIG. 6 and will not be described again. As depicted in FIG. 7, certification instructions 142, range values 144, and calibration instructions 146 are integrated to form a number of calibration tests 240-248. As illustrated by way of example for calibration tests 240 and 242, each test includes certification tests 250 and 252 followed by certification comparisons 254 and 256, respectively. Certification tests 250 and 252 are substantially identical to the perform test step 210 of the certification procedure 122; certification comparisons 254 and 256 are substantially identical to the certification comparison 212 of the certification procedure. The specific certification tests 250 and 252 performed on the function generator 44 or 45 include directing the function generator to generate an AC signal at a specific frequency and measuring the signal with a certification cart frequency counter 106.

As depicted with respect to calibration test 240, if the certification comparison 254 indicates the instrument is not functioning within allowable or rated accuracy limits, the calibration instructions 146 are invoked and a failure counter incrementation step 258 is performed. Failure counter incrementation step 258 includes the step of incrementing a cumulative calibration test counter that is established by calibration routine 126 to record the number of times the function generator 44 failed one of the calibration tests 240-248. Failure counter incrementation step 258 also includes incrementing an individual calibration test counter, also established by calibration routine 126, that records the number of times the function generator 44 failed a particular calibration test 240-246 or 248.

Following failure count incrementation step 258 is a failure count comparison 260. Failure count comparison 260 includes the steps of reading the contents of the cumulative calibration test counter to determine if the function generator failed the calibration tests 240-248 more than a predefined number of times. The step also includes reading the contents of the individual calibration test counter to determine if, for example, the function generator 44 failed calibration test 240 more than a predefined number of times. If there are either excess failures of the total calibration tests or of an individual calibration test, a flag set step 262 is performed. Flag set step 262 includes the setting of one or more flags to indicate that attempts at calibrating the out-of-certification function generation were unsuccessful. The flags set by the flag set step 262 are similar to the flags set during the flag set step 214 that is executed during the running of certification routine 122.

If the failure count comparison 260 indicates that less than the predefined number of total calibration tests 240-248 of a particular calibration test have occurred, calibration routine 126 proceeds to a calibration step 264. Calibration step 264 involves the steps of generating the appropriate calibration commands to a balancing component within the function generator 44 so as to adjust the output of the function generator. Following calibration 264 certification test 250 and certification comparison 254 are repeated.

When the function generator 44 passes the certification comparison 254 the calibration procedure proceeds to a certification test 252 and certification comparison 256 of calibration test 242. The individual calibration test counter for calibration test 240 may also be zeroed (step not shown). Calibration test 242 includes a failure count incrementation step 266, a failure counter comparison step 268, and a flag set step 269 identical to the same steps described with respect to calibration test 240. Calibration test 242 further includes a calibration step 270 that, like calibration step 264, comprises the generation of commands to a balancing component inside function generator 44 so as to calibrate it.

Following calibration step 270, the certification procedure performed by calibration routine 126 returns to the initial calibration test 240 and the certification test 250 performed therein. In other words, after each calibration 264 or 270 is performed on function generator 44, certification tests 250 and 252 are again each performed. The repetitive execution of the certification test 250 and certification comparison 254 after each calibration step is done to verify that the calibration of function generator 44 at one certification point does not result in the instrument drifting out of certification at another point. The calibration tests 240-248 are thus performed iteratively in order to ensure that the function generator 44 operates properly throughout its intended range of use.

At the conclusion of the execution of calibration routine 126, control of the ATE 18 and certification cart 100 is returned to the certification executive in a manner similar to that previously described in steps 216-230 performed during the certification procedure run by certification routine 122 (FIG. 6).

After instrument certification and calibration has been completed, personnel in the test instrument repair facility can review the instrument certification and calibration records through the test instrument site terminal 103 (FIG. 1). These records enable the instrument technicians to determine the nature of any repair work that needs to be performed on the test instruments.

The test instrument tools 154-156 and test instrument drivers 162-166 (FIG. 5) used during the certification and calibration procedures are identical to the tools and drivers in the tool library 74 and driver library 76 that are accessed by the test executive 68 and test applications 70-72 (FIG. 3). Accordingly, successful certification of the test instruments 32-48 inherently means that the tools and drivers used to manipulate the test instruments are functioning properly.

Figure 8:
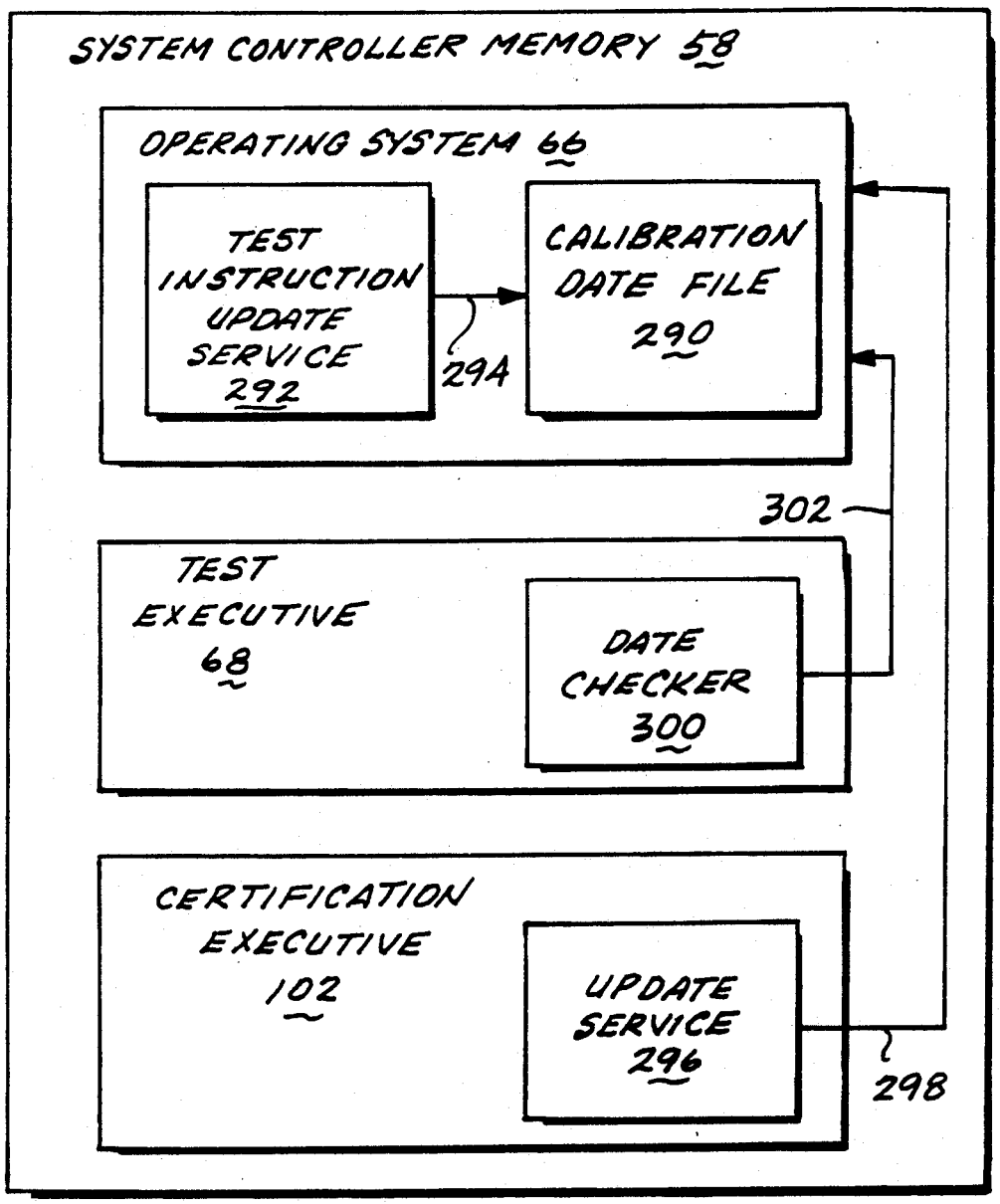
FIG. 8 is a block diagram of a portion of the system controller memory wherein checker routines that indicate whether the routines that control the automated test equipment cart instruments are depicted as separate modules.

The integrated certification-calibration system 12 of this invention also contains a set of routines as depicted by FIG. 8 for generating an indication of whenever the test executive 68 or one of the test applications 70-72 invoke an instrument tool or driver that has been updated but has not been certified. The system 12 includes a calibration-date file 290 which is maintained by part of the operating system 66. The calibration-date file 290 contains a list of the dates on which the individual tools and drivers in the libraries 74 and 76 were last updated, and an indication of the byte length of the individual tools and drivers. This information is updated by a test instruction update service 292, which is part of the operating system 66. As represented by arrow 294, the test instruction update service 292 writes the entry date and memory length information into the calibration-date file whenever the tool library 74 or driver library 76 is updated.

The calibration-date file 290 also maintains a list of the write date of the last certification or calibration involving each tool or driver, and the byte length of tool or driver when calibrated. This information is updated by an update service 296 in the certification executive 102. The update service 296 writes this information into the calibration-date file 290, as represented by arrow 298, after a certification routine or calibration routine has been executed (connection to certification routines and calibration routines not shown). This information is written by the update service 296 by reading the date and memory length information of the tools and drivers associated with the test instruments that were certified or calibrated.

Whenever the test executive 68 or one of the test applications 70-72 invoke a tool or driver in the libraries 74 or 76, a date checker 300 is initially invoked (connection not shown). The date checker 300, which is part of the test executive 68, ascertains whether the invoked tools and drivers have been certified. The date checker 300 makes the determination regarding the certification of the tool or driver by comparing the date and length of the last entered tool or driver with the date and length of the last certified tool and driver, as represented by arrow 302.

If the comparisons indicate different dates or memory lengths, it is considered an indication that the current tool or driver which the system controller 50 intends to invoke has not been certified. In this situation, the date checker 300 generates a warning notice on the display touch screen 54 that the needed tools or drivers are not certified. In order for the test technician to proceed with the intended functional test, he/she must signal to the system controller 50 that the warning has been acknowledged. The date checker 300 then allows the system controller 50 to proceed with the invocation of the selected tools and drivers. In the event the comparisons indicate identical dates and memory lengths, it is considered an indication that the current tool or driver has been certified. The date checker 300 allows the invocation of the tool or driver to proceed without the display of any additional information.

The integrated certification-calibration system 12 facilitates the efficient certification and calibration of large numbers of different test instruments 32-46. The certification routines 122 and 124 and calibration routines 126 and 128 run on the ATE system controller 50 certify and calibrate the test instruments 32-46 automatically with little or no technician assistance. Since technician involvement in the certification and calibration procedures is minimized, the level of technician support needed to perform these procedures and the possibility of technician error causing one of the procedures to be improperly performed is reduced. Furthermore, there are many instances wherein a certification routine 122 or 124, or calibration routine 126 or 128 can perform a certification or calibration procedure faster than the most efficient technician.

The certification routines 122 and 124 and calibration routines 126 and 128 integral with each ATE 14-20 are custom designed to only certify test instruments 32-46 for the functions required by the tests the ATE is designed to perform on the aircraft. This feature eliminates needless certification and calibration of each test instrument for each function of each test instrument, regardless of whether the function is used, and substantially reduces the possibility that any individual test instrument may inadvertently not be calibrated and certified for a particular test function that the instrument is required to perform.

The certification-calibration system 12 automatically archives the results of certification tests in a storage file 24. This eliminates the need to have a separate "paper trail", or certification records for the individual test instruments 32-46. Automatic archival of certification data essentially nullifies the possibility that human error can cause certification data for a test instrument to be incorrectly recorded or stored. Furthermore, the time spent making the certification records, transcribing them and storing them is minimized. Moreover, the certification records for each test instrument 32-46 can be readily accessed from the storage file 24 through a terminal connected to the central control unit 22 by instrument repair technicians, regulatory inspectors, and others requiring access to the information contained therein.

Another advantage of the certification-calibration system 12 is that it readily allows for changes in the certification requirements and calibration instructions of any test instrument on one of the ATEs 14-20. Such changes may be required if, for example, test instruments used on any ATE are changed, or the function and range of use for any particular test instrument is changed. All that is required to modify the certification or calibration procedure for the test instrument is to make the appropriate changes to the certification routine 122 or 124 or calibration routine 126 or 128 in the ATE 14-20 in which the test instrument is installed. If the test procedure that controls the use of the test instruments is changed, the certification or calibration routine for the test instrument can be changed at the same time by simply adding a new or modified routine to the ATE from a test development site 78 through the central control unit 22. Since the certification and calibration routines 122-128 are provided with the ATEs 14-20, there is no need to take the certification cart 100 out of service each time it is necessary to change a certification or calibration routine.

The certification-calibration system 12 also inherently certifies the software tools and drivers that control the test instruments. If the tools and drivers have been changed and are not certified, the date checker 300 generates a warning message so the test technician is made aware of the software's status before functional testing is allowed to proceed.

Still another advantage of this system 12 is that the certification and calibration routines 122-128 are in a certification executive 102 that is separate from the test executive 68 and the test applications 70-72. This makes it possible to update the certification and calibration routines 122-128 without affecting the test executive or the test applications.

The foregoing description has been limited to a specific embodiment of this invention. It will be apparent, however, that the invention can be practiced in systems having diverse designs or in systems that use different internal elements than those disclosed in this specification, with the attainment of some or all of the advantages of this invention. For example, it should be understood that in other embodiments of this invention, different certification instruments may be used to certify test instruments different from those described in the disclosed test system. Similarly, it should be understood that the exact arrangement of the programs used to control both the test instruments and certification instruments may vary significantly from what has been described. For example, in some embodiments of the invention, it may be desirable to provide common tool and driver libraries that are accessed both during the running of automated functional tests and during the running of certification and calibration procedures.

The steps of the certification and calibration procedures with respect to the execution of certification routine 122 and calibration routine 126, respectively, were similarly described as applied in a preferred embodiment of the invention, for purposes of illustration. The specific steps of any given certification or calibration procedure performed by a certification or calibration routine in accordance with this invention may vary widely from what has been described. For example, some calibration routines may not include the steps related to determining how many times a particular test instrument failed each certification test or all of the certification tests. Other certification routines may not include the steps of returning to perform each certification test over after any particular calibration step is performed. Other calibration routines may not perform any calibration steps until after each of the certification tests are performed.

Moreover, the system 12 may also be configured to provide notices of when the ATEs 14-20 need to be certified. For example, in one embodiment of the invention, the central control unit 22 may have a cart certification notice service (not illustrated). This service maintains a record of the date each ATE 14-20 was last certified. Each ATE 14-20 needs to be certified periodically, for example, every 60 days. Towards the end of each 60-day period for each ATE 14-20, for example, during the last week of the period, the cart certification notice service arranges to have a scheduling notice broadcast as the appropriate test development site and test inspection site terminals 76, 78 and 103, respectively, The service also arranges for scheduling notices to be broadcast on the ATE display screen 54. The scheduling notice broadcast provides test personnel and cart scheduling personnel with a notice that a cart needs to be certified. This facilitates the orderly scheduling of cart certification so that there will be minimum disruption of the functional testing process.

Therefore, it is the object of the appended claims to cover all such modifications and variations as come within the true spirit and scope of the invention.

The embodiments of the invention in which an exclusive property or privilege is claimed are defined as follows:

1. A certification system for certifying a plurality of processor-controllable test instruments, the test instruments being arranged in at least two groups of separate test instruments, wherein each said test instrument generates signals for application to a unit under test or monitors signals generated by said unit under test, said certification system comprising:
   a. a plurality of processor-controllable certification instruments for certifying the test instruments by measuring the signals produced by the test instruments or by producing signals that are monitored by the test instruments;
   b. connection means for selectively interconnecting each of said at least two groups of test instruments to said certification instruments; and
   c. at least two system controllers wherein each said system controller is integrally associated with each group of test instruments, is connected to the test instruments associated therewith has an input/output unit selectively connectable to said certification instruments, and is operable to perform certification tests on the associated test instruments by directing said certification instruments to measure signals produced by the associated test instruments or to produce signals for monitoring by the associated test instruments and includes means for receiving and storing the results of said certification tests.

2. The certification system of claim 1, wherein said certification instruments are attached to a portable housing.

3. The certification system of claim 2, wherein each said system controller further includes at least two certification routines, each said certification routine comprising a set of system controller-executable instructions directing said system controller to perform a certification test with said certification instruments on one of the test instruments associated with said system controller, said certification routines containing instructions directing said system controller to perform different certification tests.

4. The certification system of claim 2, wherein each of said at two groups of test instruments has a signal interface cable for connecting the test instruments to said certification instruments, at least two of said signal interface cables having different connection means for attachment to said certification instruments, said certification system further including:
   a. a receiver board on said housing to which said certification instruments are connected; and
   b. a plurality of interface test adapters, each said interface test adapter being selectively attachable to said receiver board for providing an electrical interconnection between at least one of the signal interface cables and said receiver board.

5. The certification system of claim 2, further including:
   a processor-controllable switch matrix integrally associated with the certification instruments, electrically connected to said certification instruments and to a selected group of the test instruments, said switch matrix selectively establishing electrical connections between the selected group of test instruments and said certification instruments; and wherein
   each said system controller is connectable to said switch matrix to control said electrical connections established thereby during said certification tests.

6. The certification system of claim 4, further including:
   a processor-controllable switch matrix on said housing for selectively establishing electrical connections between one group of the test instruments and said certification instruments over said receiver board-interface test adaptor-signal interface cable interconnection;
   each said system controller being connectable to said switch matrix and operable for controlling said electrical interconnections established thereby during said certification tests.

7. The certification system of claim 2, further including:
   a central control unit including a memory, said central control unit being adapted for connection to said system controllers for reading and storing said results of the certification tests in said central control unit memory;
   said system controller input-output units being adapted so that said central control unit can be connected thereto.

8. The certification system of claim 2, wherein said system controllers each include means for storing acceptable limits of the test results for each certification test performed thereby, said system controllers comparing results of said tests with said limits during said certification tests.

9. The certification system of claim 8, wherein said system controllers inhibit use of at least one of the test instruments for a test function subjected to said certification tests if a selected certification test result is outside of said acceptable limits.

10. The certification system of claim 8, wherein at least one of the test instruments is processor-calibratable, and said system controller associated with the processor-calibratable test instrument is operative to calibrate the test instrument when a certification test result for the test instrument is outside said acceptable limits for one of said certification tests.

11. The certification system of claim 3, wherein each said system controller includes a plurality of test applications, each said test application comprising a set of system controller-executable instructions directing said system controller to perform a functional test with said test instruments, and said certification routines are contained within a certification executive separate from said test applications.

12. The certification system of claim 11, wherein said certification executive further includes a menu/controller for selectively invoking said certification routines for execution.

13. A method of certifying test instruments arranged in at least two groups of separate test instruments, wherein each said test instrument generates signals for application to a unit under test or monitors signals generated by said unit under test and said each group of test instruments having a system controller connected to the test instruments for controlling the functional tests performed thereby, the method including the steps of:
   a. providing each said system controller with a plurality of certification routines wherein each said certification routine comprises a set of system controller-executable instructions directing the system controller associated therewith to perform a certification test on one of the test instruments associated with the system controller using a certification instrument to certify the test instrument, wherein each said certification routine contains instructions directed to the system controller associated therewith to perform a different certification test;

b. selectively connecting said each group of test instruments to a group of certification instruments, each said certification instrument being controlled by the system controllers in response to the execution of at least one of said certification routines stored in one of the system controllers, and connecting the system controller associated with the connected test instruments to said certification instruments; and c. directing the system controller to execute one of said certification routines associated therewith so as to perform a certification test on at least one of the test instruments.

14. The method of certifying instruments of claim 13, further including the steps of:

a. connecting at least one signal interface cable between the selected group of test instruments and said group of certification instruments; and b. establishing electrical interconnections between said selected group of test instruments and said group of certification instruments with at least one switch matrix responsive to commands from the system controller.

15. The method of certifying instruments of claim 14, wherein said at least two groups of test instruments have associated therewith signal interface cables with different cable heads, said method further including the step of:

connecting a selected interface adaptor to said selected group of test instruments, said interface adaptor having a socket adapted for connecting said signal interface cable head of the group of test instruments to be certified thereto.

* * * * *

UNITED STATES PATENT AND TRADEMARK OFFICE
CERTIFICATE OF CORRECTION

PATENT NO. : 5,115,407
DATED : May 19, 1992
INVENTOR(S) : R.W. Bird et al.

It is certified that error appears in the above-identified patent and that said Letters Patent is hereby corrected as shown below:

| COLUMN | LINE | |
|---|---|---|
| 3 | 44 | after "certification" insert --or calibration-- |
| 7 | 62 | after "and" insert --a-- |
| 9 | 49 | "instruction" s/r --instructions-- |
| 13 | 63 | "includes" s/r --include-- |
| 18 | 55 & 56 | "respectively," s/r --respectively.-- |
| 19 | 19 | "therewith" s/r --therewith,-- |
| 19 | 42 | after "at" insert --least-- |

Signed and Sealed this

Fourteenth Day of September, 1993

*Attest:*

BRUCE LEHMAN

*Attesting Officer*     *Commissioner of Patents and Trademarks*